(12) United States Patent
Yoo

(10) Patent No.: US 7,507,667 B2
(45) Date of Patent: Mar. 24, 2009

(54) SELECTIVE HEATING USING FLASH ANNEAL

(75) Inventor: Woo Sik Yoo, Palo Alto, CA (US)

(73) Assignee: WaferMasters, Inc., San Jose, CA (US)

(*) Notice: Subject to any disclaimer, the term of this patent is extended or adjusted under 35 U.S.C. 154(b) by 179 days.

(21) Appl. No.: 11/744,446

(22) Filed: May 4, 2007

(65) Prior Publication Data

US 2007/0207612 A1 Sep. 6, 2007

Related U.S. Application Data

(63) Continuation of application No. 11/061,712, filed on Feb. 18, 2005, now Pat. No. 7,276,457, which is a continuation-in-part of application No. 10/677,512, filed on Oct. 1, 2003, now Pat. No. 6,911,376.

(51) Int. Cl.
H01L 21/44 (2006.01)
(52) U.S. Cl. ............... 438/687; 438/795; 257/E21.324; 257/E21.347; 257/E21.568

(58) Field of Classification Search ............. 438/687, 438/795; 257/E21.077, E21.324, E21.347, 257/E21.568
See application file for complete search history.

(56) References Cited

U.S. PATENT DOCUMENTS

| | | | |
|---|---|---|---|
| 4,439,245 A * | 3/1984 | Wu ............................ 117/8 |
| 5,725,914 A * | 3/1998 | Opower ..................... 427/592 |
| 6,103,624 A | 8/2000 | Nogami et al. |
| 6,623,799 B1 | 9/2003 | Lee et al. |
| 6,746,969 B2 | 6/2004 | Shimada et al. |
| 6,809,035 B2 | 10/2004 | Yoo |
| 6,849,831 B2 | 2/2005 | Timans et al. |
| 6,951,996 B2 | 10/2005 | Timans et al. |

* cited by examiner

Primary Examiner—Charles D. Garber
Assistant Examiner—Stanetta D Isaac
(74) Attorney, Agent, or Firm—Haynes and Boone, LLP.; Tom Chen

(57) ABSTRACT

A copper film is treated by applying light at short wavelengths, e.g., at less than 0.6 μm, to heat the copper film and generate a large temperature gradient from the surface of the copper to the interface between the copper and underlying silicon. As a result, grain growth in the copper is enhanced.

20 Claims, 12 Drawing Sheets

FIG. 2B  FIG. 2C

SELECTIVE HEATING USING FLASH ANNEAL

CROSS REFERENCE TO RELATED APPLICATIONS

The present application is a continuation of U.S. application Ser. No. 11/061,712, filed Feb. 18, 2005 now U.S. Pat. No. 7,276,457, which is a continuation-in-part application of U.S. application Ser. No. 10/677,512, filed Oct. 1, 2003 now U.S. Pat. No. 6,911,376.

BACKGROUND OF THE INVENTION

1. Field of the Invention

This invention generally relates to semiconductor manufacturing equipment and, more particularly, to a method of manufacturing a semiconductor device with a copper layer on silicon.

2. Related Art

Integrated circuits fabricated on semiconductor substrates for very and ultra large scale integration typically require multiple levels of metal layers to electrically interconnect the discrete layers of semiconductor devices on the semiconductor chips. The different levels of metal layers are separated by various insulating or dielectric layers (also known as inter-level dielectric (ILD) layers), which have etched via holes to connect devices or active regions from one layer of metal to the next.

As semiconductor technology advances, circuit elements and dimensions on wafers or silicon substrates are becoming increasingly more dense. Consequently, the interconnections between various circuit elements and dielectric layers need to be as small as possible. One way to reduce the size of interconnection lines and vias is to use copper (Cu) as the interconnect material instead of conventionally used materials such as aluminum (Al). Because copper has lower resistivities and significantly higher electromigration resistance as compared to aluminum, copper advantageously enables higher current densities experienced at high levels of integration and increased device speed at higher frequencies. Thus, major integrated circuit manufacturers are transitioning from aluminum-based metallization technology to dual damascene copper technology. Copper interconnect lines can also be made thinner than aluminum lines, which reduces crosstalk between the lines.

However, as devices get smaller and smaller, the copper lines become increasingly thinner and narrower. Due to the characteristics of copper, as the copper lines become thinner and narrower, the resistivity of the copper increases and approaches that of aluminum. One way to reduce the resistivity is to self-anneal the copper, i.e., the copper undergoes a re-crystallization at room temperature. This results in a reduction in resistivity and a physical change in the copper structure. Sheet resistance, in the past, has been reduced by annealing at room temperature for a longer time.

However, copper self-anneal does not grow larger grains. Larger grain sizes are advantageous for reducing adverse effects from the change in the copper microstructure. The adverse effects include a higher resistance in the lines with very small dimension due to electron scattering from grain boundaries, defects, and surfaces. One method to grow larger grains, while still reducing sheet resistance, is to anneal the copper at temperatures higher than room temperature, e.g., greater than 100° C. This results in growing larger grains, along with clear grain boundaries.

FIG. 1 shows a simplified processing chamber 10, in which a wafer 12 with a copper film, can be heated. Typically heat lamps 14, such as infrared lamps, disposed throughout the chamber heat wafer 12 during processing. In addition, a susceptor 16 underneath the wafer can also be used to heat wafer 12. Lamps 14 may be disposed within or in a chamber housing. However, such conventional heating methods heat the copper at a limited rate, which oftentimes does not grow the grains sufficiently, resulting in a copper film that does not meet standards or requirements.

Therefore, there is a need for forming copper films that overcomes the disadvantages of conventional methods discussed above.

SUMMARY

According to one aspect of the present invention, light or energy with a wavelength of approximately 0.6 μm or less is applied to a copper film on a silicon layer or substrate. In one embodiment, the wavelength is less than approximately 0.5 μm. Copper, at these shorter wavelengths, absorbs photons or light energy, which enable the copper to be more quickly heated. This results in a large temperature gradient from the copper surface to the interface of the copper and silicon. Consequently, grain growth is enhanced.

In accordance with one embodiment, the resultant energy is provided at a high intensity such that only a short exposure time is necessary to heat the region defined by the copper film to a temperature required to enhance grain growth. The heat treatment, referred to as a "flash" anneal process, may be accomplished using an energy source, which provides the resultant energy output, as seen by the wafer. Beneficially, the resultant energy can be uniformly disposed over the copper film surface to permeate through the copper film. Because the resultant energy is uniform over the diameter of the substrate there is no significant heating overlap.

Typical, heating for annealing of copper has required heating of the entire wafer. The selective heating of primarily just the region defined by the copper film allows for concentrated heating through the entire thickness of the copper film to the copper/silicon interface. Since the flash anneal process is substantially instantaneous, the production time is increased as well.

These and other features and advantages of the present invention will be more readily apparent from the detailed description of the embodiments set forth below taken in conjunction with the accompanying drawings.

BRIEF DESCRIPTION OF THE FIGURES

FIGS. 2A to 2D are simplified cross-sectional views illustrating respective steps of a method of fabricating a wafer in accordance with the present invention;

DETAILED DESCRIPTION

As used herein, the word "flash" includes it ordinary meaning as generally understood by those of ordinary skill in the art. This definition includes the definition that flash means to give off light energy suddenly or substantially instantaneous (or in transient bursts) for a duration of time between about 1 nanosecond and about 10 seconds.

Figure 3:
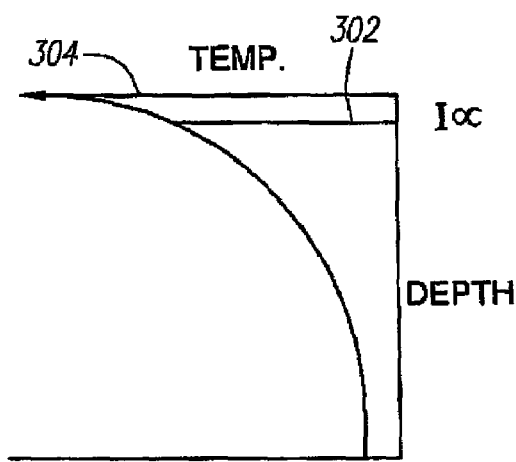
FIG. 3 is a simplified illustration of the active layer of a wafer in accordance with principles of the present invention.

The active layer of a portion of a semiconductor wafer is well known in the semiconductor manufacturing industry as that portion of the wafer in which semiconductor devices are formed, such as transistors, diodes, resistors, and capacitors. For example, referring to FIG. 3, active layer 302 extends from surface 304 of a wafer down to a depth a below surface 304. In this example, with no intent to be limiting, the depth $\alpha$ is typically between about 0.05 µm and 1 mm, but will vary with the process and device feature size.

Figure 1:
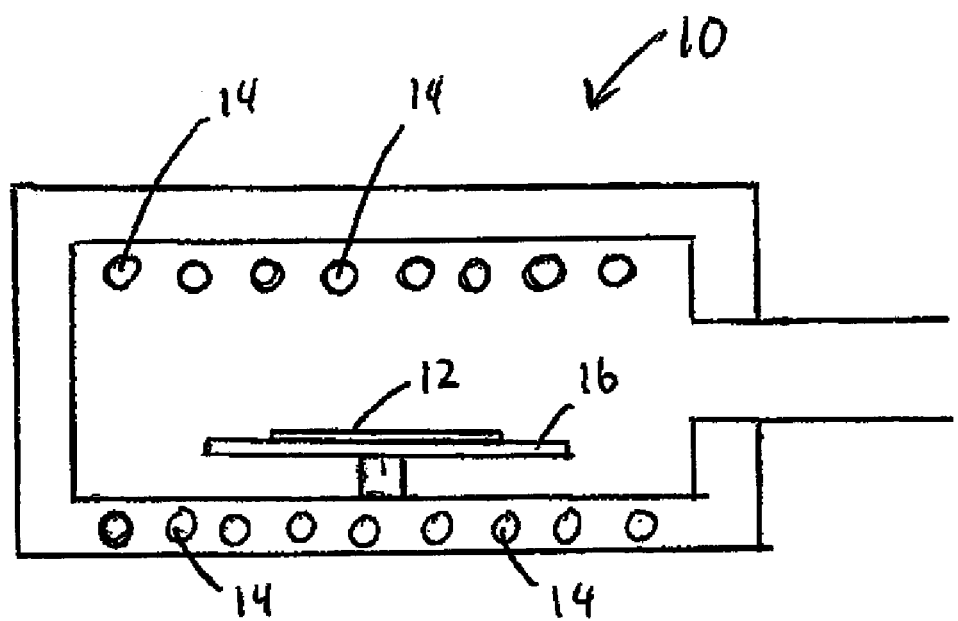
FIG. 1 is simplified view of a conventional processing chamber for heating a wafer.
Figure 2A:
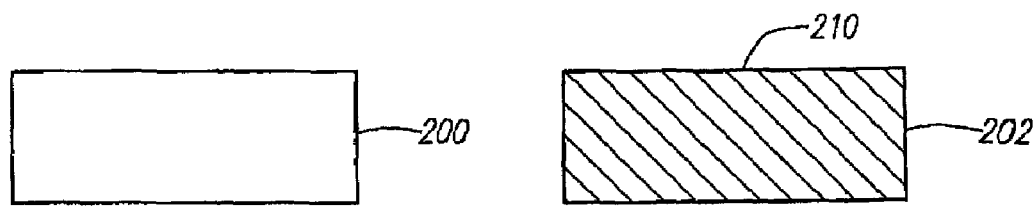

FIGS. 2A to 2D are simplified cross-sectional views illustrating respective steps of a method of fabricating a wafer in accordance with an embodiment of the present invention. As illustrated in FIG. 2A, two substrates are provided, a silicon substrate 200 and a support substrate 202. Silicon substrate 200 can be any type of silicon substrate including substrates containing oxygen. Silicon substrate 200 can be fabricated by well known processes, such as Float Zone (FZ) and Magnetic Chochralski (MCZ) processes.

Support substrate 202, may include any type of silicon wafer or other foreign substrate material. In one embodiment, support substrate 202 may include a glass capable of withstanding high temperatures in the range of 800° C. or greater, such as quartz, sapphire, SiC, and diamond. A SOI substrate or wafer, which uses a form of glass as the support substrate can be referred to as silicon-on-quartz (SOQ) substrate or wafer. In other embodiments, support substrate 202 can include other foreign materials, such as, GaAs, GaP, InP, GaN, and $Al_2O_3$ and is referred to as a silicon-on-foreign (SOF) substrates or wafers. Optionally, support substrate 202 may have a $SiO_2$ layer formed on a surface thereof.

With the exception of specific distinguishing references to SOQ or SOF substrates and wafers, all references to SOI substrates and SOI wafers shall apply equally to SOQ substrates, SOQ wafers, SOF substrates and SOF wafers.

As shown in FIG. 2B, a $SiO_2$ layer 204 is formed on a surface of silicon substrate 200 using well known techniques, such as thermal oxidation, to provide an insulating layer. $SiO_2$ layer 204 provides the function of a buried oxide film generally required for fabrication of an electronic device on a substrate. Thus, the thickness of $SiO_2$ layer 204 should be made adequate to provide this function. For example, the thickness of $SiO_2$ layer 204 is between about 10 Å and about 5000 Å.

After $SiO_2$ layer 204 has been formed, hydrogen is ion-implanted into surface 208 of silicon substrate 200 through $SiO_2$ layer 204. The hydrogen ion-implantation 206 is made at a desired depth into silicon substrate 200. The depth for hydrogen implantation 206 is the depth at which silicon substrate 200 separates when subjected to heat treatment. Thus, as described in more detail below, the piece of the separated silicon substrate 200 that remains with $SiO_2$ layer 204, shall become an SOI active layer 304 (FIG. 3) in the resulting SOI structure. Accordingly, the depth of ion implantation 206, which is a function of the acceleration energy of the implanted ions, can be controlled to ensure that the SOI active layer has a desired thickness. In one embodiment, silicon substrate 200 is implanted at about 30-200 KeV with doses of about $1 \times 10^{16}$ $H^+$ $cm^{-2}$ to about $3 \times 10^{17}$ $H^+$ $cm^{-2}$.

In an alternative embodiment, ions of different gases, such as helium ions, may be implanted into silicon substrate 200 along with hydrogen ions to facilitate separation of silicon substrate 200.

Referring again to FIG. 2D, to bury $SiO_2$ layer 204 between silicon substrate 200 and support substrate 202, silicon substrate 200 is turned over and laid on top of support substrate 202, such that surface 208 of silicon substrate 200 makes direct contact with surface 210 of support substrate 202. Typically, a chemical bond material is used to bond the silicon and support substrates together to form SOI structure 212.

Figure 2D:
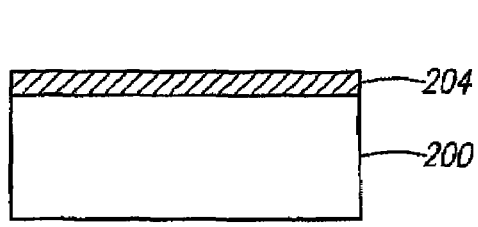
Figure 2D:
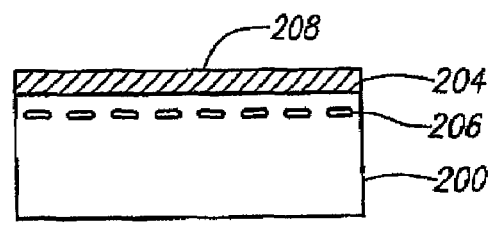
Figure 2D:
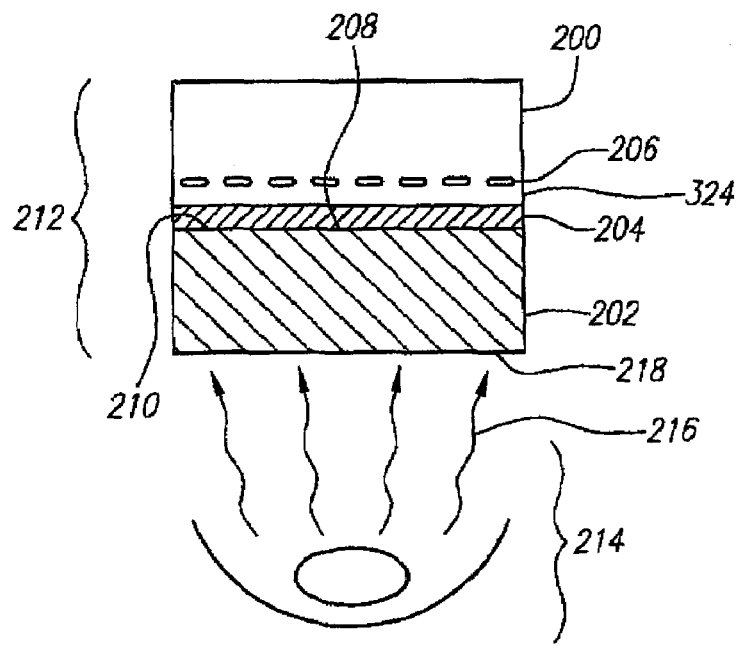

FIG. 2D shows a simplified illustration of an embodiment of a flash anneal assembly 214 in accordance with the present invention. Flash anneal assembly 214 is used to provide a heat treatment to SOI structure 212. In this embodiment, flash anneal assembly 214 is positioned proximate to SOI structure 212, such that radiation energy 216 emitted from flash anneal assembly 214 can impinge on SOI structure 212, specifically through surface 218 on support substrate 202. As described in detail below, radiation energy 216 heats hydrogen ion-implantation 206 to a temperature required to cause silicon substrate 200 to separate.

Figure 5A:
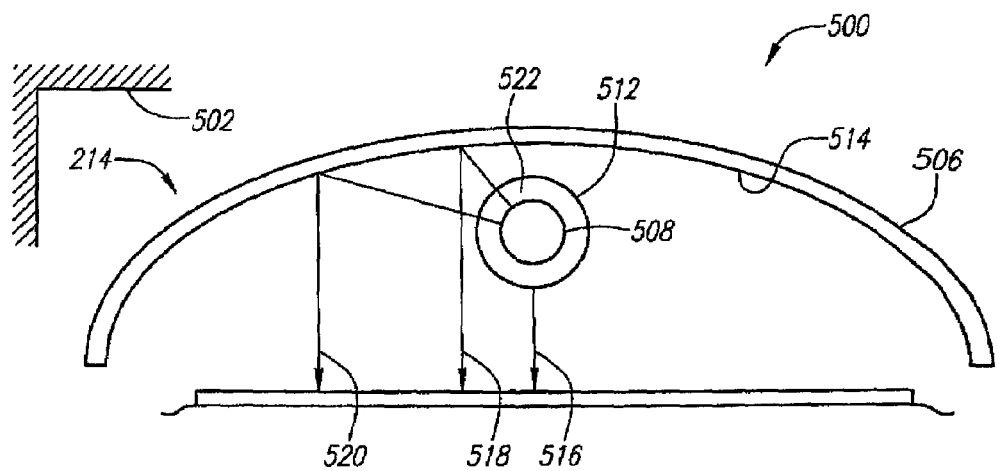
FIGS. 5A and 5B are simplified illustrations of an embodiment of a flash anneal apparatus in accordance with the present invention.
Figure 5B:
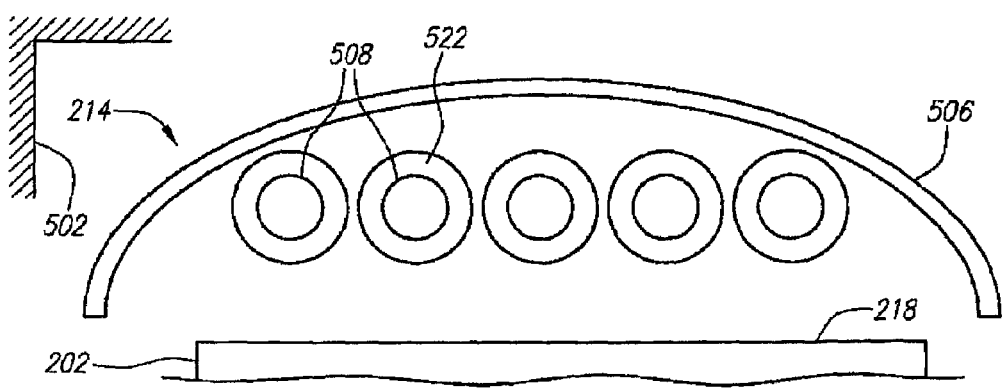

Referring now to FIGS. 5A and 5B, in one embodiment, to create SOI structure 212, the structure is positioned in a process chamber 502, which includes flash anneal assembly 214. In one embodiment, flash anneal assembly 214 may include a reflector 506 and a radiation energy source 508.

Flash anneal assembly 214 may be positioned within process chamber 502 proximate to a surface 218 of support substrate 202, such that in operation, flash anneal assembly 214 can be made to heat the ion implantation 206 region of silicon substrate 200 through the bulk of support substrate 202 using the radiation energy emitted from radiation source 508.

In one embodiment, radiation energy source 508 can be a high-intensity lamp of the type conventionally used in lamp heating operations. In this embodiment, radiation energy source 508 is a filament-less lamp, such as a Xe arc lamp (hereinafter "lamp 508"). Lamp 508 can be any suitably shaped lamp, for example, a cylindrical tube shaped lamp that has a length at least as long as the diameter of surface 218 of support substrate 202. While FIG. 5A is a simplified illustration of an embodiment, in which a single lamp is shown disposed proximate to reflector 506, it should be understood that any number of lamps 508 can be used, as shown in FIG. 5B, to achieve the desired heating levels required of a specific process.

In one embodiment, lamp 508 can be surrounded by a flow tube 512. Flow tube 512 can contain a cooling fluid 522, for example, deionized water. Cooling fluid 522 is used to keep lamp 508 from overheating during operation. For example, cooling fluid can keep the temperature of lamp 508 under 100° C. to keep any quartz components of lamp 508 from melting. In another embodiment, cooling fluid 522 can be mixed with a non-conductive die. The non-conductive die can act as a filter to keep only certain wavelengths from emanating from lamp 508 through flow tube 512.

Referring again to FIG. 5A, flash anneal assembly 214 is in operational arrangement with surface 218 of support substrate 202. Reflector 506 includes an inner surface 514, which can be highly reflective of certain wavelengths and absorptive or non-reflective of others. In one embodiment, inner surface 514 can be coated with a material, which has the reflecting/absorbing characteristic. For example, inner surface 514 may be coated with gold or silver, where the silver is further coated with a protection coating, such as SiN or any transparent coating, which prohibits oxidation of the silver. The coating efficiently reflects wavelengths of less than 900 nm, to produce an average wavelength of between about 900 nm and about 200 nm. In another embodiment, inner surface is highly reflective across the full spectra of ultra violet (NV), infrared (IR) and visible wavelengths.

In one embodiment, the wavelength of light energy passing through support substrate 202 can be tailored so that some level of effective energy can pass through to ion implantation 206 regardless of the material composition of support substrate 202. For example, if support substrate is made of silicon, then the wavelength of the light energy made to impinge on support substrate 202 may be tailored to be in the range of 250 nm to 1 µm, which can penetrate the silicon. Similarly, if support substrate is made of quartz the wavelength of the light energy can be tailored to include a larger spectrum of effective wavelengths, such as between 400 nm and 2 µm. A support substrate of another material can be bombarded with light energy that has similarly been tailored to penetrate the material thereof. In each embodiment, the flash of radiation energy can cause about 0.5 J/cm$^2$ to about 100 J/cm$^2$ to be concentrated at ion implantation region 206.

To facilitate the concentration of energy at ion implantation 206, reflector 506 may be formed into any suitable geometric shape. For example, reflector 506 may be flat, spherical, elliptical or parabolic. The light energy from lamp 508 can be focused at the center or focal point of reflector 506 to be directed toward surface 218 of support substrate 202. The radiation emitted from lamp 508 and reflected from inner surface 514 of reflector 506 impinges on surface 218 of support substrate 202, as simply and representatively illustrated by rays 516, 518 and 520, to provide a uniform temperature distribution across the surface of surface 218 of support substrate 202, which heats the ion implantation 206.

Figure 12A:
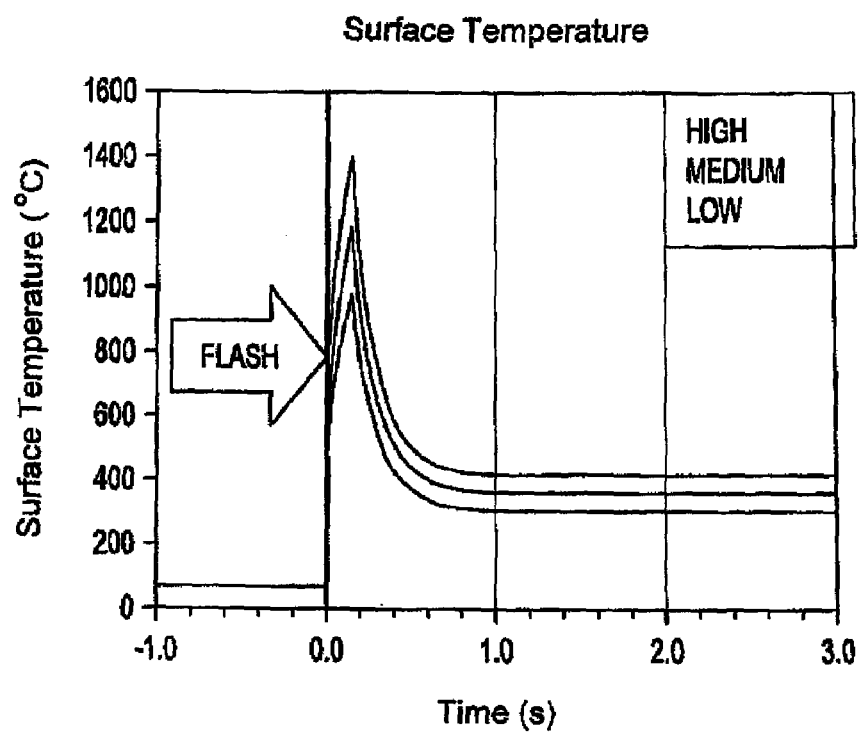
FIG. 12A is a FIG. 12A is a graphical representation of the surface temperature of the wafer as a function of time in accordance with one embodiment of the present invention.

The temperature to which ion implantation 206 is heated is a function of the relationship between the power supplied to lamp 508 and the length of time which the radiation energy is allowed to impinge on surface 218 of support substrate 202. As shown in FIG. 12A, in one embodiment, the temperature of ion implantation 206 may be raised to an annealing temperature in the range from between about 500° C. (low) to about 1400° C. (high). To achieve these temperatures, the wafer is exposed to a flash in accordance with the present invention, which provides light energy suddenly or substantially instantaneously, for example, for a duration of time between about 1 nanosecond and about 10 seconds, for example, less than 1 second. The power level can range from between about 0.5 J/cm$^2$ and about 100 J/cm$^2$.

Figure 12B:
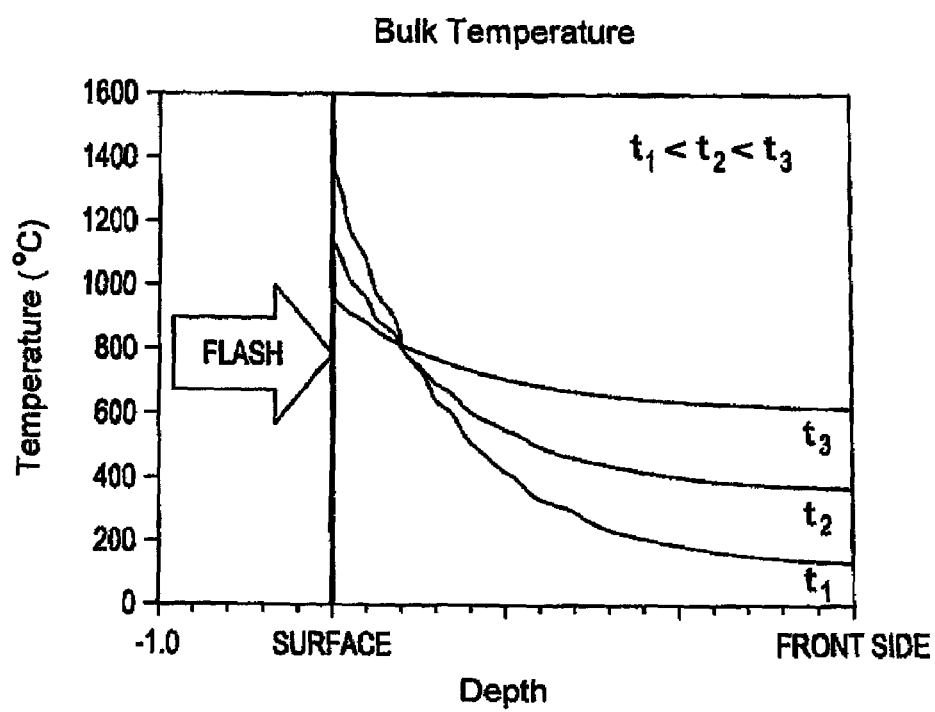
FIG. 12B, is a graphical representation of the bulk temperature of the wafer as a function of the increase in depth towards the opposing surface in accordance with one embodiment of the present invention.

As illustrated in the graph shown in FIG. 12B, the bulk temperature of the wafer diminishes as a function of the increase in depth towards the opposing surface. Beneficially, the flash anneal process described above substantially heats only the ion implantation 206 to the desired temperature, thus protecting the remaining silicon substrate 200 from experiencing significant thermal expansion before separation of the substrates 200 and 202.

Figure 4A:
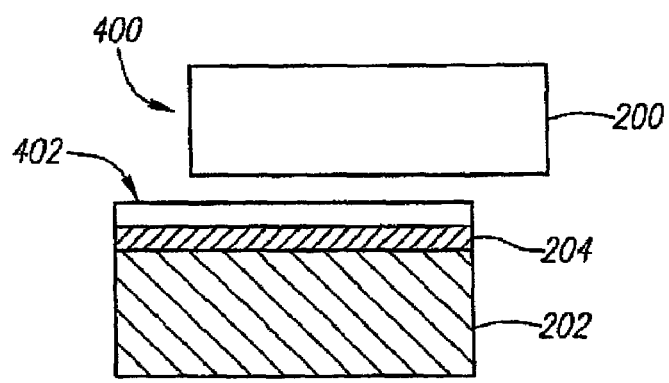
FIGS. 4A and 4B are simplified cross-sectional views illustrating respective steps of a method of fabricating a wafer in accordance with the present invention.
Figure 4B:
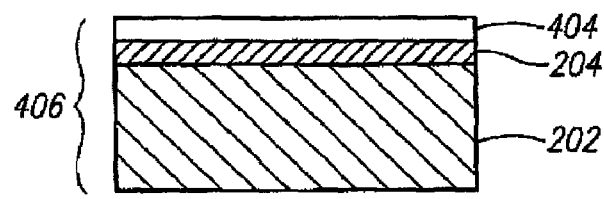

FIGS. 4A and 4B are simplified cross-sectional views representing additional steps in the SOI structure formation in accordance with the present invention. Once the flash anneal process raises the temperature of the ion implantation region to the desired temperature, silicon substrate 200 separates at a region defined by the depth of ion implantation 206 thereby creating a first piece 400 and a second piece 402.

First piece 400 represents a remainder of the original silicon substrate 200. Second piece 402 is a portion of original silicon substrate 200 which remains bonded to support substrate 202 having SiO$_2$ layer 204 sandwiched therebetween. As shown in FIG. 4B, second piece 402 becomes active layer 404 of SOI structure 406.

Advantageously, the flash anneal allows for the heating of ion implantation 206 without significantly heating the bulk of structure 212 (FIG. 2D). Thus, adverse effects that would otherwise be attributed to the heating of the entire structure 212 are avoided. Accordingly, materials can be bonded to silicon substrates, for example quartz, which forms SOQ without causing the destruction of the SOI structure. For the same reasons, a wide range of other materials, such as SiC, GaAs, GaP, InP, GaN, and Al$_2$O$_3$ may also be bonded to silicon substrates to form SOF structures.

Figure 6:
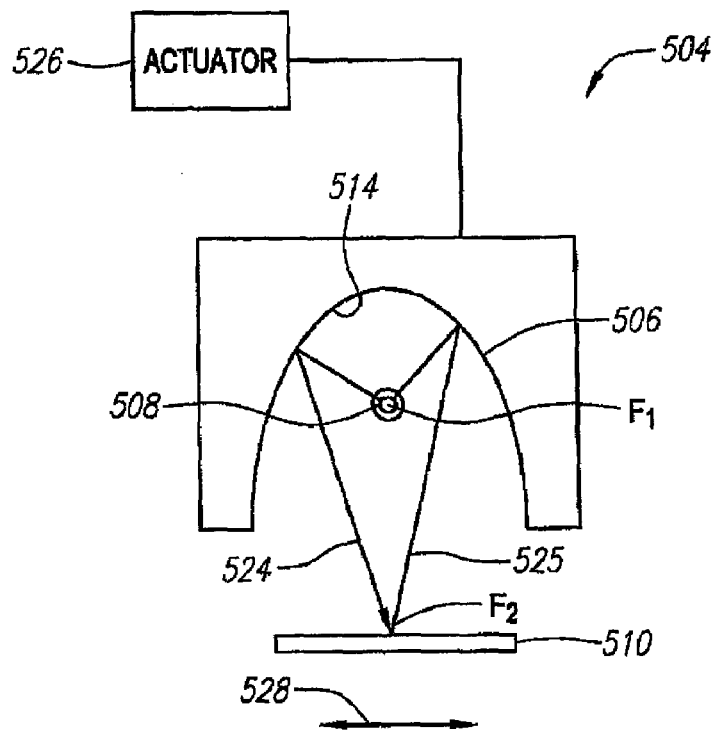
FIG. 6 is a simplified illustration of a flash anneal apparatus using the reflector assembly of FIGS. 5A and 5B in accordance with the present invention.

Other embodiments of flash anneal assembly 214 can be used interchangeably in the present invention to provide the flash anneal. For example, FIG. 6 is a simplified illustration of an alternative embodiment of flash anneal assembly 214. In this alternative embodiment, reflector 506 may be formed into an ellipse, which has two focal points F$_1$ and F$_2$. Lamp 508 can be positioned at focal point F$_1$, such that the energy is reflected from inner surface 514, exemplified by rays 524 and 525, and focused at the second focal point F$_2$. Surface 218 of support substrate 202 can be positioned at focal point F$_2$, such that the energy can be used to impinge on surface 218 of support substrate 202.

In this embodiment, the entire wafer surface can be subjected to the energy focused at F$_2$, by moving surface 218 of support substrate 202 relative to focal point F$_2$. For example, actuator 526 can be used to provide a conventional means for causing flash anneal assembly 214 to scan over surface 218 of support substrate 202. Actuator 526 may be configured to move either surface 218 of support substrate 202 or flash anneal assembly 214 to provide a back and forth scanning motion, as indicated by arrow 528, across surface 218 of support substrate 202.

Figure 7:
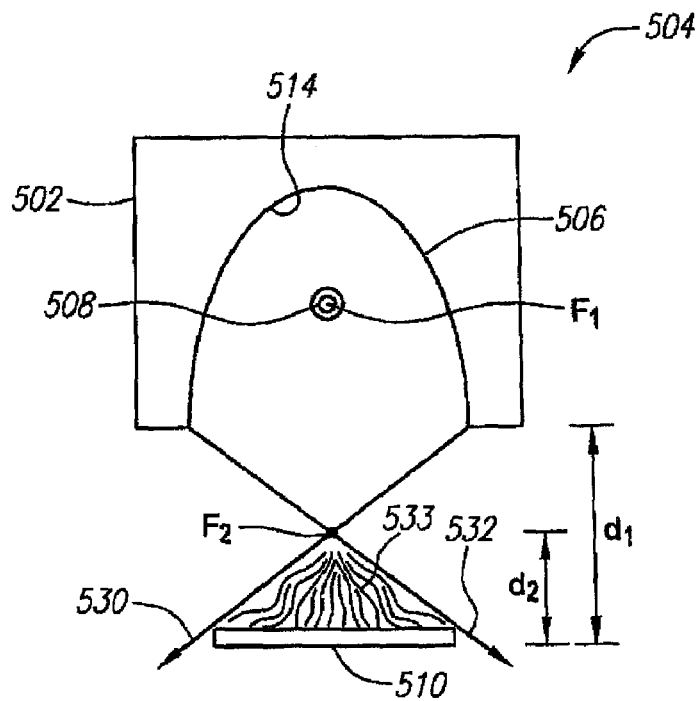
FIG. 7 is a simplified illustration of an alternative embodiment of the reflector assembly of FIG. 6 in accordance with the present invention.

FIG. 7 is a simplified illustration of another embodiment of flash anneal assembly 214 in accordance with the present invention. In this embodiment, reflector 506 is formed into an ellipse, with two focal points F$_1$ and F$_2$. Lamp 508 is positioned at focal point F$_1$, such that the energy is reflected from inner surface 514 and focused at focal point F$_2$. In this embodiment, surface 218 of support substrate 202 is set back a distance d$_1$ from flash anneal assembly 214 and/or a distance d$_2$ from focal point F$_2$. Distances d$_1$ and d$_2$ are selected such that surface 218 of support substrate 202 is fully engulfed within a radiation beam 533 emanating from focal point F$_2$. Beam 533, outlined by rays 530 and 532, covers the entire surface area of surface 218 of support substrate 202, such that the entire surface of surface 218 of support substrate 202 is subjected simultaneously to substantially all of the reflected energy from lamp 508 to impinge on surface 218 of support substrate 202 and heat ion implantation 206.

Figure 8:
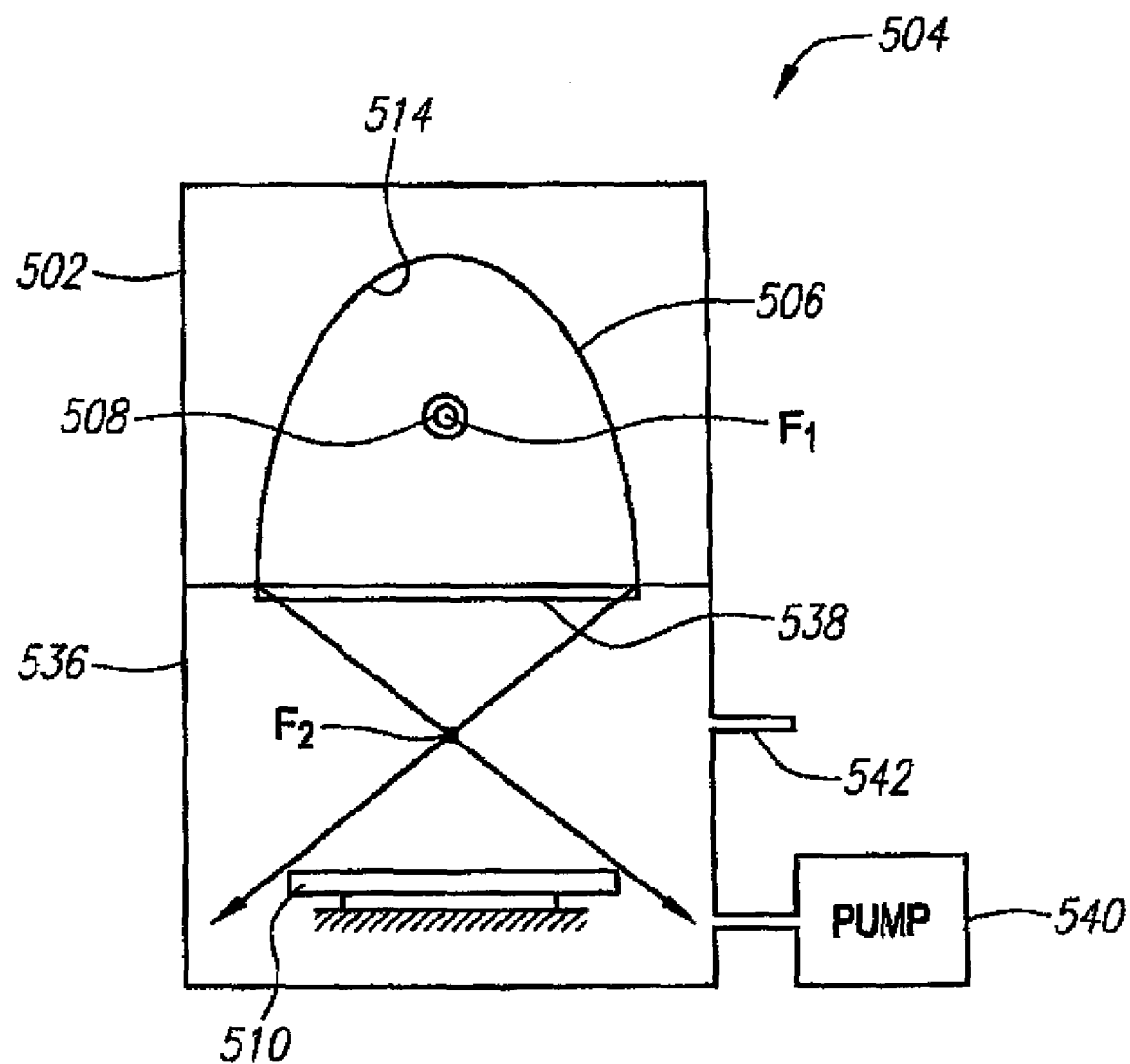
FIG. 8 is a simplified illustration of an alternative embodiment of the reflector assembly of FIG. 6 in accordance with the present invention.

FIG. 8 is a simplified illustration of yet another embodiment of flash anneal assembly 214 in accordance with the present invention. In this embodiment, process chamber 502 including flash anneal assembly 214 may be mounted external to a second process chamber 536. Flash anneal assembly 214 can be positioned above an optical window 538, which is provided between chambers 502 and 536 to allow the radiation energy emitted from lamp 508 to enter second process chamber 536 and impinge on surface 218 of support substrate 202. Optical window 538 may be made of any material that allows for the transmission of the radiation energy, for example, quartz. Window 538 may have a thickness of between about 1 mm and about 5 mm and a diameter that is at least as great as or greater than surface 218 of support substrate 202.

Second process chamber 536 can be pulled to vacuum, for example, using a pump 540. Second chamber 536 can also be filled through inlet 542 with a non-oxygen gas, such as $N_2$. During the processing of surface 218 of support substrate 202, the vacuum or non-oxygen environment ensures that the transmission of ultra-violet (UV) wavelengths from lamp 508 can reach surface 218 of support substrate 202 heat ion implantation 206.

Although second process chamber 536 with quartz window 538 has been illustrated using the embodiment of flash anneal assembly 214 of FIG. 7, the second process chamber 536 and quartz window 538 can be used with all of the embodiments of flash anneal assembly 214 described herein. It should also be understood that chambers 502 and 536 may be a single chamber.

Figure 9A:
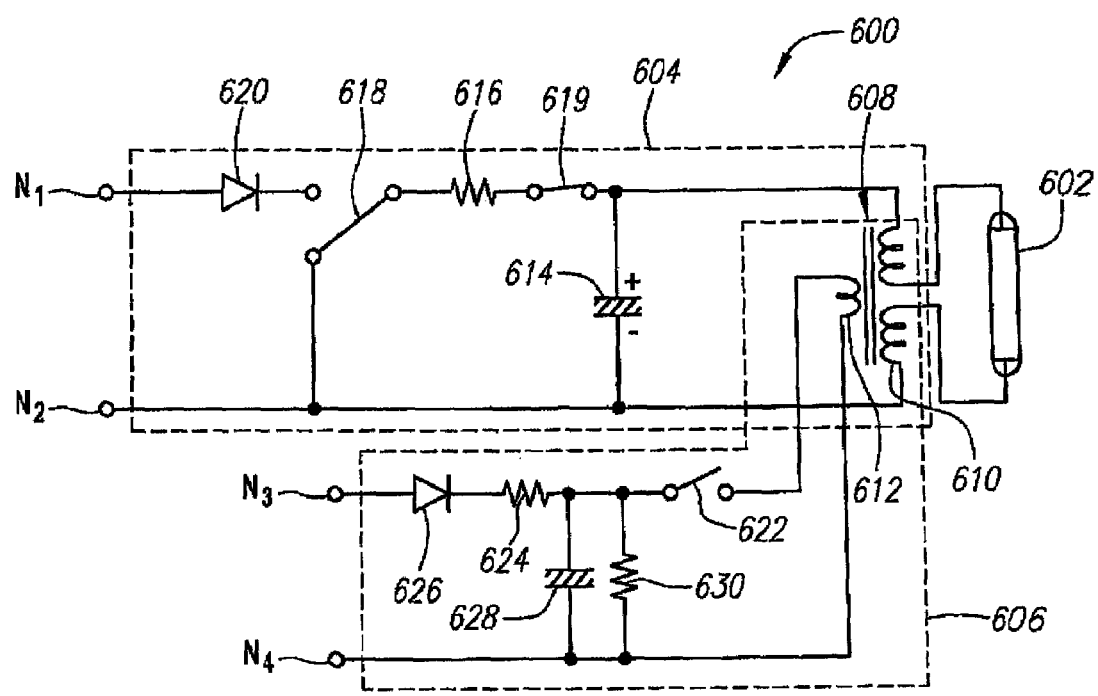
FIGS. 9A-9D are simplified circuit diagrams of a power supply to ignite a lamp in accordance with an embodiment of the present invention.

FIGS. 9A-9D are simplified circuit diagrams of a power supply 600 for a lamp 602 in accordance with an embodiment of the present invention. As shown in FIG. 9A, power supply 600 includes a main circuit 604 and an ignition circuit 606. In one embodiment, main circuit 604 includes an ignition transformer 608 whose primary winding 610 can be supplied with a voltage $V_1$, and whose secondary winding 612 ignites lamp 602 with the stepped-up value of voltage $V_1$. In this embodiment, a capacitor 614 is provided in parallel to a series connection of primary winding 610 and a controllable switch 618. Capacitor 614 can be of any desired capacitance, for example, between about 10 μF and 100 F. Switch 618 can be, for example, any suitable manual switch, electromagnetic relay or solid state device.

In this embodiment, capacitor 614 can be connected in parallel with a resistor 616 and a diode 620 provided in series with resistor 616. When charging capacitor 614, resistor 616 acts as a current limiter and/or a dummy load. Capacitor 614 is charged when supply voltage $V_1$ is activated across nodes $N_1$ and $N_2$. Voltage $V_1$ can be an AC voltage supplied via a direct line or a transformer output. Voltage $V_1$ can be adjustable and may range from between about 200 VAC and 5000 VAC.

Ignition circuit 606 supplies the ignition energy with the aid of a pulse switch 622. For this purpose, ignition circuit 606 is provided with secondary winding 612 of ignition transformer 608. A resistor 624, in series with diode 626, is provided in series with secondary winding 612 and pulse switch 622. A capacitor 628, disposed in parallel to a shunt resistor 630, is in series connection to secondary winding 612. Capacitor 628 can be of any desired capacitance, for example, between about 0.1 RF and 100 μF. Capacitor 628 can be charged by a voltage $V_2$, placed across nodes $N_3$ and $N_4$. Voltage $V_2$ can be an AC voltage supplied via a direct line or a transformer output. Voltage $V_2$ can be adjustable and may range from between about 200 VAC and 1000 VAC. Alternatively, for simplicity, nodes $N_1$ and $N_2$ can be electrically coupled to nodes $N_3$ and $N_4$ so as to share the same power source.

Figure 9B:
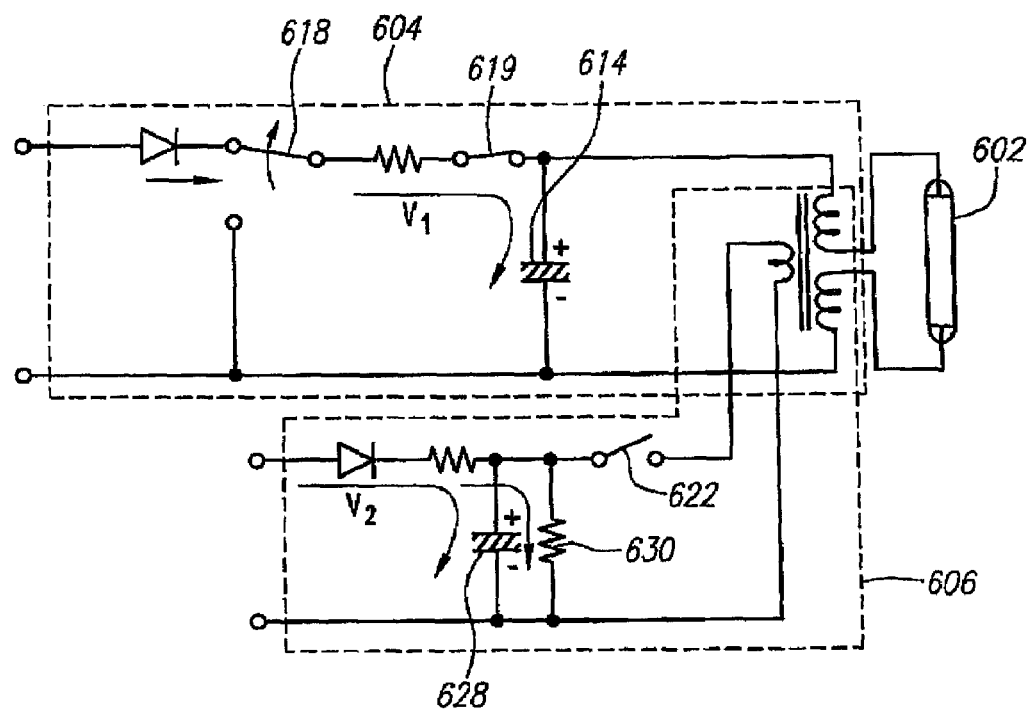

FIG. 9B shows an embodiment of primary circuit 604 and ignition circuit 606 where switches 618 and 619 are closed to allow supply voltage $V_1$ to be applied between nodes $N_1$ and $N_2$, to begin the charging via resistor 616 of capacitor 614. At the same time, capacitor 628 of ignition circuit 606 is charged via resistor 624 with voltage $V_2$ applied between nodes $N_3$ and $N_4$.

Figure 9C:
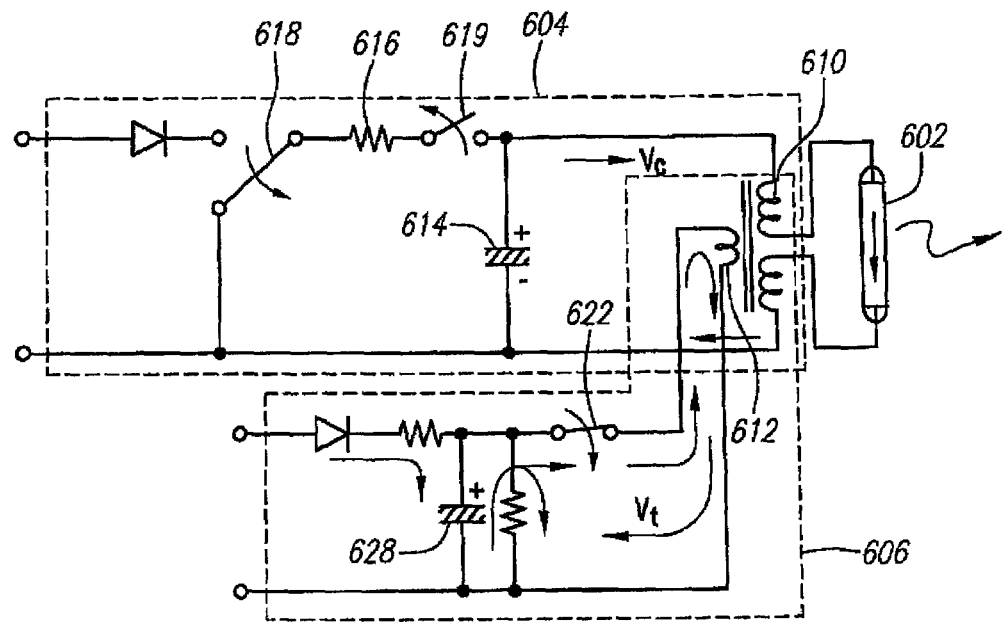

FIG. 9C shows an embodiment, such that when capacitor 614 is charged to a desired capacity, switch 618 can be opened and switch 619 can be opened, thus removing the effect of supply voltage $V_1$ on capacitor 614 and allowing a voltage $V_c$ to be supplied from capacitor 614 across primary windings 610. Impulse switch 622 can be closed to allow capacitor 628 to discharge, such that a voltage $V_t$ is supplied across secondary windings 612. According to the transmission ratio of ignition transformer 608, a current flux generates a stepped-up voltage in primary windings 610 that is high enough to energize lamp 602.

Figure 9D:
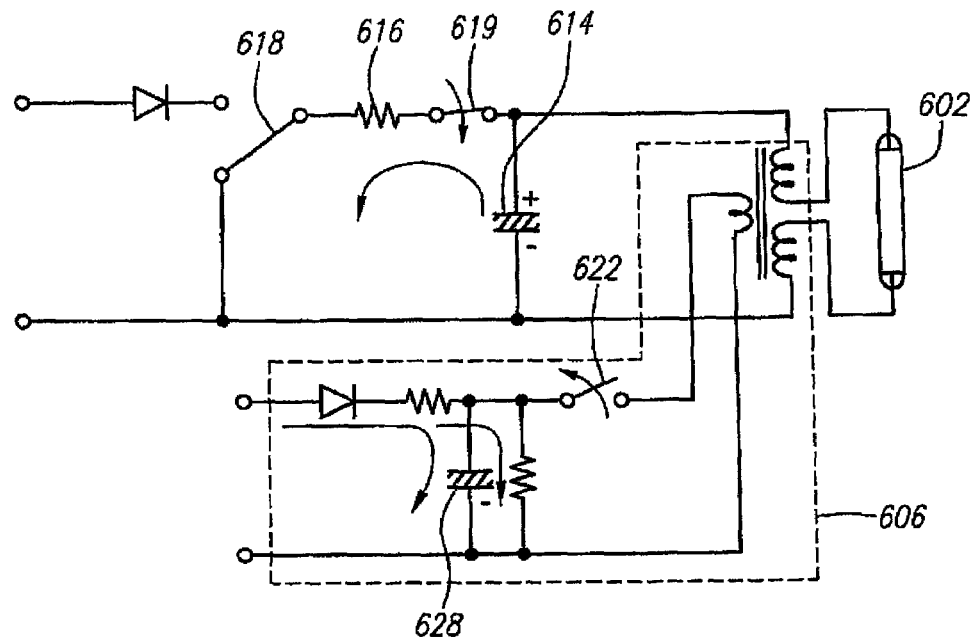

As shown in FIG. 9D, once lamp 602 has been energized as desired, switch 622 can be released (i.e. opened) and switch 619 can be closed to allow capacitor 614 to continue to discharge via the dummy load supplied through resistor 616. In this configuration, capacitor 628 of ignition circuit 606 begins to be re-charged once switch 622 is opened. Primary circuit 604 can be re-charged with the closing of switch 618.

Figure 10:
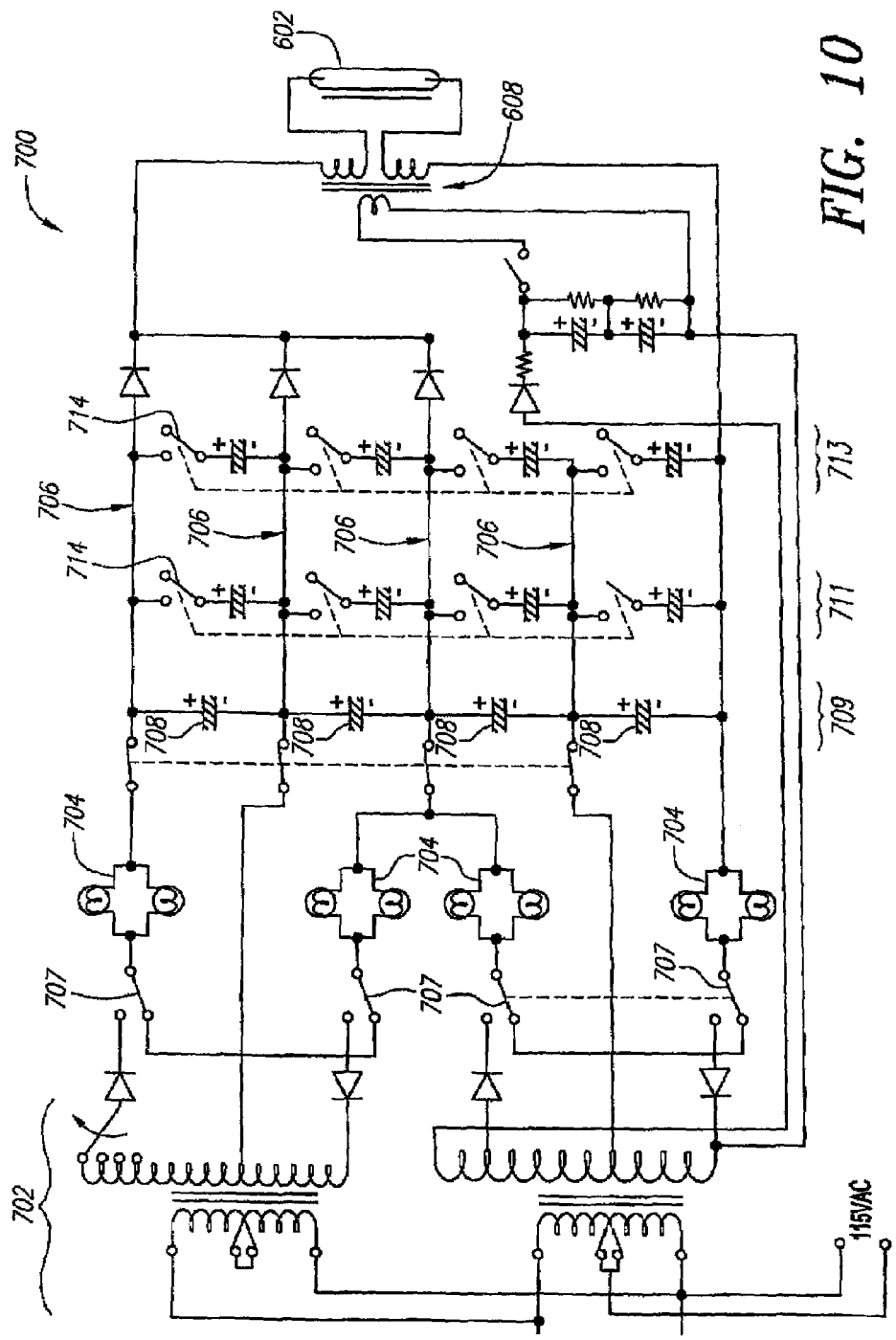
FIG. 10 is an embodiment of a power supply circuit in accordance with the principles of the present invention.

FIG. 10 is an embodiment of a power supply circuit 700 configured using the principles described in reference to FIGS. 9A-9D. This embodiment illustrates the versatility of power supply circuit 700. As best understood with reference to FIG. 10, capacitors 708 from a plurality of primary circuits 706 can be stacked together to be used in conjunction with one another to increase the charge storing capacity of power supply 700. The stacked capacitors 708 form a first rack 709. Each primary circuit 706 can be connected together upon the closing of switches or relays 707. As the capacity of the voltage is increased a plurality of capacitor racks, such as second rack 711 and third rack 713 can be connected in parallel with first rack 709 via a set of switches 714. The racks 709, 711, and 713 can be used together to vary the capacitance and thus the power level supplied to lamp 602.

FIG. 10 illustrates additional versatility of power supply 700. For example, AC power source 702 can be configured to provide a variable voltage, ranging for example between about 200 VAC and about 5000 VAC. In addition, resistor 704 of the primary circuit can be a halogen lamp or similar device, which can be used to dissipate heat energy and also provide a visual indication that the capacitor in the circuit is being charged or discharged.

Figure 11:
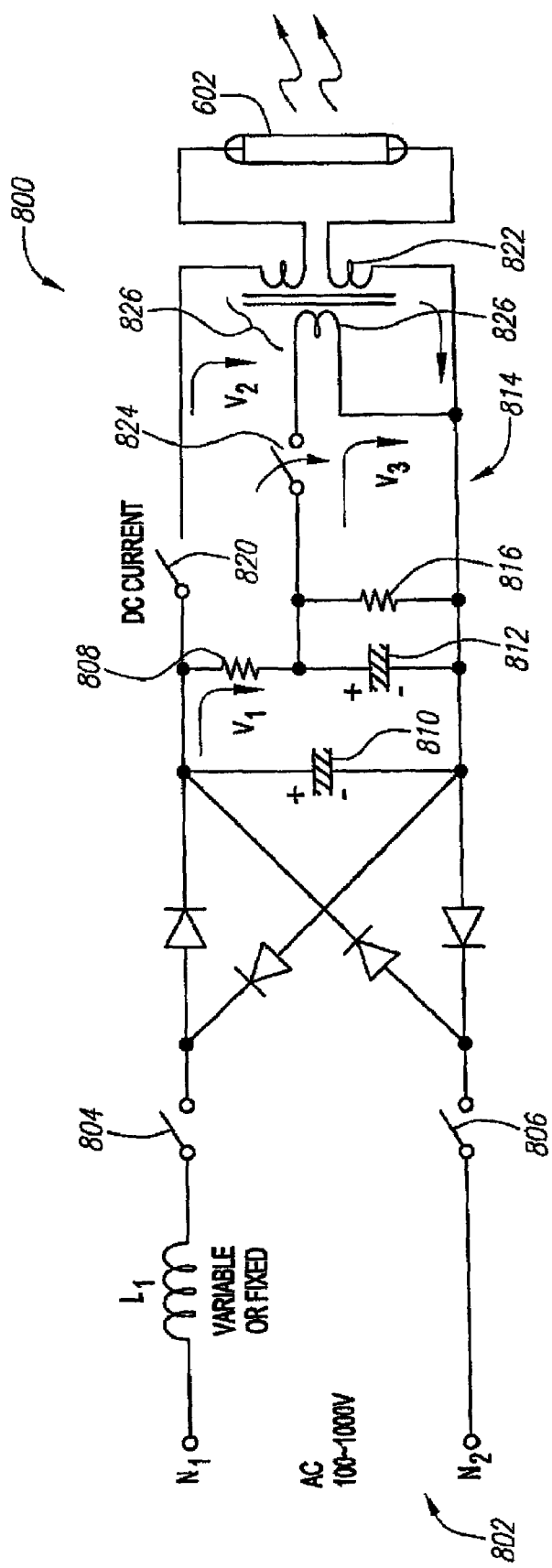
FIG. 11 is an embodiment of a power supply circuit in accordance with the principles of the present invention.

FIG. 11 is an embodiment of a power supply circuit 800 using the principles described in reference to FIGS. 9A-9D with the additional ability to allow a continuous powering of lamp 602. Accordingly, power supply circuit 800 can provide a flash exposure to the radiation energy of lamp 602 followed by a continuous component of exposure to the radiation energy of lamp 602. Power supply circuit 800 includes power circuit 802, where switches 804 and 806 when closed allow an AC supply voltage $V_1$ to be applied between nodes $N_1$ and $N_2$, to begin the charging via resistor 808 of capacitor 810. At the same time, capacitor 812 of ignition circuit 814 is charged via resistor 816. A set of diodes 818 are provided to convert the AC voltage supply to a DC voltage supply. When capacitors 810 and 812 are charged to desired capacities, switch 820 is closed allowing a voltage $V_2$ to be supplied from capacitor 810 across primary windings 822. Impulse switch 824 can be closed to allow capacitor 812 to discharge, such that a voltage $V_3$ is supplied across secondary windings 826. According to the transmission ratio of ignition transformer 826, a current flux generates a stepped-up voltage in primary windings 822 that is high enough to energize lamp 602. Once ignition switch 824 is released, voltage $V_2$ remains across the primary windings to allow lamp 602 to remain energized and, thus producing a radiation energy output. In this manner, discharge time can be controlled.

U.S. Pat. No. 6,376,806, commonly assigned to the assignee of the present invention, is herein incorporated by reference for all purposes.

Figure 13:
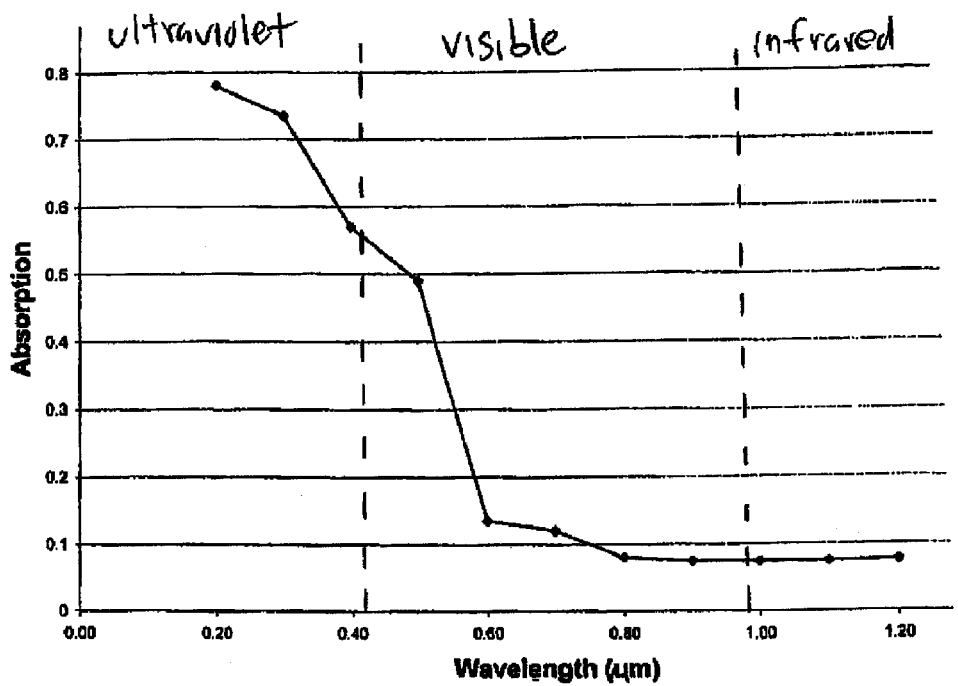
FIG. 13 is a graph showing the absorption of energy as a function of wavelength for copper.

According to another embodiment of the present invention, radiation energy 216 or energy from lamp 508 is directed toward the surface of a copper film formed over a silicon substrate or layer. The wavelength of the energy is less than approximately 0.6 µm, which corresponds to ultraviolet light and short wavelength visible light. Energy at higher wavelengths, such as infrared light or long wavelength visible light, is mainly reflected by the copper. FIG. 13 is a chart showing the amount of photon or energy absorption in copper as a function of wavelength. As seen from the chart, light at wavelengths less than approximately 0.6 µm, the absorption starts to increase dramatically from approximately 0.13 to approximately 0.78 at 0.2 µm. At approximately 0.5 µm, about 50% of the photon energy is absorbed by the copper. At wavelengths of 0.6 µm and higher, the absorption is less than 0.15, so that almost all of the energy is reflected by the copper. Thus, light at wavelengths less than 0.6 µm, and preferably less than 0.5 µm, directed to a copper surface will quickly heat the copper due to this energy absorption. Consequently, lamp 508 may be any suitable light or energy source, such as an ultraviolet lamp, that generates light at these short wavelengths.

Figure 14:
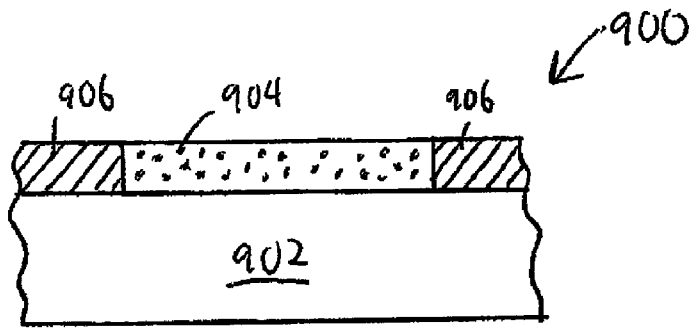
FIG. 14 is a simplified cross-sectional view of a portion of a wafer treated with low wavelength light according to one embodiment

FIG. 14 is a simplified cross-sectional view of a semiconductor device 900 treated by "short" wavelength light, according to one embodiment. Device 900 includes a silicon substrate 902 having a copper layer or film 904 formed on at least a portion of the surface of silicon substrate 902. Silicon substrate 200 can be any type of silicon substrate including substrates containing oxygen. Substrate 200 may already have been subjected to a variety of processes associated with the formation of integrated circuits. As shown in FIG. 14, an insulating layer 906, such as a dielectric, covers other portions of the surface of silicon substrate 902. Copper layer 904 can be any suitable copper film or layer used during the device manufacturing process, such as a via, a line, a sheet, or a via and line. Suitable thicknesses of the copper layer are between approximately 10 nm and approximately 100 µm in one embodiment. Light at short wavelengths directed to copper layer 904 quickly and effectively heats the copper. Typical treatment times at the short wavelengths range from 1 ms to 3600 seconds. In some embodiments, the short wavelength treatment of the film is provided in conjunction with heat, where the heat ranges from room temperature to approximately 500° C. in one embodiment. As a result, with or without the added heat a large temperature gradient, e.g., 0.01 to 100 C/nm, is generated in the depth direction from the copper surface to the interface between silicon and copper. The large thermal gradient enhances grain growth in the copper. Both average annealing temperature and temperature gradient within the Cu layer enhances grain growth.

Having thus described embodiments of the present invention, persons skilled in the art will recognize that changes may be made in form and detail without departing from the spirit and scope of the invention. The above description describes treating a copper film or layer with short wavelength light. However, other materials that absorb a majority of energy from photons from a light source may also be suitable with the present invention. Examples include any type of heterostructures (e.g., SOG (spin on glass), SOD (spin on dielectrics), SOI (silicon on insulator), SOQ (silicon on quartz), compound semiconductor on Si, tandem solar cell, ITO (indium tin oxide) on Si, and the like. Thus the invention is limited only by the following claims.

What is claimed is:

1. A method for treating a semiconductor device during a manufacturing process, the method comprising:
   providing a copper layer over a silicon substrate;
   selecting a wavelength for a flash annealing process based solely on inherent energy absorption characteristics of the copper layer; and
   flash annealing the copper layer at a wavelength of approximately 0.6 µm or less to heat the layer with a broad spectrum energy source.

2. The method of claim 1, wherein the layer is between approximately 10 nm and 1000 µm thick.

3. The method of claim 1, wherein the wavelength is approximately 0.5 µm or less.

4. The method of claim 1, further comprising providing heat to the layer.

5. The method of claim 1, wherein the layer is heated approximately between room temperature and approximately 500° C.

6. The method of claim 1, wherein the flash annealing is directional and only toward the surface of the layer.

7. The method of claim 1, wherein the method is performed with a single pulse.

8. The method of claim 1, wherein the selecting is from an energy absorption curve for the copper layer.

9. The method of claim 1, wherein the broad spectrum energy source compnses a lamp.

10. The method of claim 9, wherein the lamp is a xenon lamp.

11. A method of enhancing grain growth in a copper film, the method comprising:
    forming the copper film on a silicon substrate;
    selecting a wavelength based on absorption data of the copper film; and
    flash annealing with a broad spectrum energy source at a wavelength of approximately 0.6 µm or less to the surface of the copper film to heat the copper film and generate a large temperature gradient from the surface of the copper film to the interface of the copper film and the silicon substrate.

12. The method of claim 11, wherein the copper film is between approximately 10 nm and 1000 µm thick.

13. The method of claim 11, wherein the wavelength is approximately 0.5 µm or less.

14. The method of claim 11, further comprising providing heat to the copper film and silicon substrate.

15. The method of claim 14, wherein the heat is approximately room temperature to approximately 500° C.

16. The method of claim 11, wherein the flash annealing is only to the surface of the copper film.

17. The method of claim 11, wherein the broad spectrum energy source comprises a lamp.

18. The method of claim 17, wherein the lamp is a xenon lamp.

19. The method of claim 11, wherein the absorption data is an energy absorption curve for copper.

20. The method of claim 11, wherein the method is performed with a single pulse.

* * * * *